United States Patent
Yoon et al.

(10) Patent No.: US 8,026,592 B2
(45) Date of Patent: Sep. 27, 2011

(54) THROUGH-SILICON VIA STRUCTURES INCLUDING CONDUCTIVE PROTECTIVE LAYERS

(75) Inventors: Minseung Yoon, Seoul (KR); Namseog Kim, Gyeonggi-Do (KR); Pyoungwan Kim, Gyeonggi-do (KR); Keumhee Ma, Gyeongsangbuk-do (KR); Chajea Jo, Gyeonggi-Do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 134 days.

(21) Appl. No.: 12/408,369

(22) Filed: Mar. 20, 2009

(65) Prior Publication Data

US 2010/0038800 A1    Feb. 18, 2010

(30) Foreign Application Priority Data

Aug. 18, 2008   (KR) ........................ 10-2008-0080494

(51) Int. Cl.
 *H01L 23/04* (2006.01)
(52) U.S. Cl. ................ 257/698; 257/774; 257/E23.011; 257/E21.597; 438/667
(58) Field of Classification Search ............ 257/E21.597
See application file for complete search history.

(56) References Cited

U.S. PATENT DOCUMENTS

| | | | |
|---|---|---|---|
| 5,229,647 A * | 7/1993 | Gnadinger | 257/785 |
| 6,322,903 B1 * | 11/2001 | Siniaguine et al. | 428/617 |
| 6,573,567 B1 | 6/2003 | Nishizawa et al. | |
| 6,693,361 B1 * | 2/2004 | Siniaguine et al. | 257/777 |
| 6,916,725 B2 | 7/2005 | Yamaguchi | |
| 7,214,615 B2 | 5/2007 | Miyazawa | |
| 7,282,444 B2 | 10/2007 | Tanida et al. | |
| 2003/0173678 A1 * | 9/2003 | Mizukoshi | 257/774 |
| 2004/0245623 A1 | 12/2004 | Hara et al. | |
| 2007/0172986 A1 | 7/2007 | Huang et al. | |
| 2008/0237881 A1 * | 10/2008 | Dambrauskas et al. | 257/774 |

FOREIGN PATENT DOCUMENTS

| | | |
|---|---|---|
| JP | 2007-194669 A | 8/2007 |
| JP | 2007-294821 A | 11/2007 |
| KR | 10-2005-0054479 A | 6/2005 |

\* cited by examiner

*Primary Examiner* — Ha Tran T Nguyen
*Assistant Examiner* — Shaka Scarlett
(74) *Attorney, Agent, or Firm* — Myers Bigel Sibley & Sajovec, P.A.

(57) ABSTRACT

Through-Silicon-Via (TSV) structures can include a conductive via through a substrate extending from an upper surface of the substrate to a backside surface of the substrate opposite the upper surface, a conductive protective layer including Ni and/or Co can be at a bottom of the conductive via, and a separate polymer insulating layer can be on the backside surface of the substrate in contact with the conductive protective layer.

18 Claims, 16 Drawing Sheets

THROUGH-SILICON VIA STRUCTURES INCLUDING CONDUCTIVE PROTECTIVE LAYERS

CROSS-REFERENCE TO RELATED APPLICATIONS

The present application claims priority to Korean Patent Application No. 2008-0080494, filed in the Korean Intellectual Property Office on Aug. 18, 2008, the disclosure of which is incorporated herein by reference.

FIELD OF THE INVENTION

The present invention relates to the field of semiconductors in general, and more particularly, to Through-Silicon-Via structures and methods of forming.

BACKGROUND

Advances in integration technology have led to the development of a three dimensionally stacked LSI approach taken in favor of the conventional two-dimensional LSI approach. Some types of three dimensional integration include package stacking, die stacking, and wafer stacking. Among the wafer stacking approach, a technique called Through-Silicon-Via (TSV) can be used to extend a via hole through a substrate so that a conductive via may be formed that completely penetrates the substrate. In turn, multiple substrates including TSVs can be stacked on one another to achieve three dimensional integration. In particular, the TSVs of different substrates can conduct signals from one substrate to another without the use of, for example, wires.

Two approaches that can be used in the formation of TSVs include a "via first" approach and a "via last" approach. According to a via first approach, TSVs are formed through the substrate before a back end of line process, for example, a metal interconnection process, is accomplished. Furthermore, the via first approach may be used before CMOS devices are formed in the substrates. According to the via first approach, vias can be formed in the substrates to only partially penetrate the substrate wherein after the CMOS and back end of line processing can be provided. Subsequently, the substrates can be thinned so that the vias are exposed and bound together to achieve a three-dimensional stacked structure.

Alternatively, the TSVs can be formed after the formation of the CMOS devices but before the back end of line processing. In particular, the CMOS devices can be formed on the substrate whereupon the vias can be formed to partially penetrate the substrate. Then, the back end of line processing can be provided and followed by a thinning process to complete the TSVs. Finally, the substrates having the TSVs formed therein can be bonded together to provide the three dimensionally stacked structure.

According to the via first approach, vias can be formed in the substrate either before the CMOS devices are formed or before the back end of line processing is provided. For example, the vias can be formed before the formation of CMOS devices by first forming vias that partially penetrate the substrate. Then, the C-MOS and back end of line processing can be provided and followed by a thinning process, which can complete the formation of the TSVs and the substrate. Subsequently, multiple substrates including the TSVs can be bonded together to provide the three dimensionally stacked structure.

According to the via last approach, the vias can be formed during or after the back end of line processing (BEOL) or after a bonding process. When the TSVs are formed during the BEOL, the process can be referred to as a "TSV middle process." Conventionally, the TSV middle process can be included in the TSV last process as well. For example, processes for the formation of layer in a CMOS process, such formation of ILD, metal 1 TSV, and metal 2 processes.) For example, the via last approach can be used to provide TSVs after the back end of line processing, but before bonding by forming CMOS devices and a back end of line processing before the formation of vias which partially penetrate the substrate. Subsequently, a thinning process can be used to complete the TSV structure, which penetrates the substrate whereupon a bonding process can be used to connect the substrates including the TSV structures to provide the three dimensionally stacked structure.

Alternatively, the via last approach can be used to provide the TSVs after the bonding. For example, the CMOS and back end of line processing can be provided and followed by the bonding of separate wafers together. The bonding wafers can then be thinned to form the TSVs to provide the three dimensionally stacked structure.

TSV structures are also discussed in, for example, the following U.S. patent documents: U.S. Pat. Nos. 6,916,725, 7,214,615, 7,282,444, and U.S. Patent Publication No. 2004/0245623.

SUMMARY

Embodiments according to the invention can provide Through-Silicon-Via (TSV) structures including a conductive via through a substrate extending from an upper surface of the substrate to a backside surface of the substrate opposite the upper surface, a conductive protective layer comprising Ni and/or Co at a bottom of the conductive via, and a separate polymer insulating layer on the backside surface of the substrate in contact with the conductive protective layer.

DESCRIPTION OF EMBODIMENTS ACCORDING TO THE INVENTION

Figure 1:
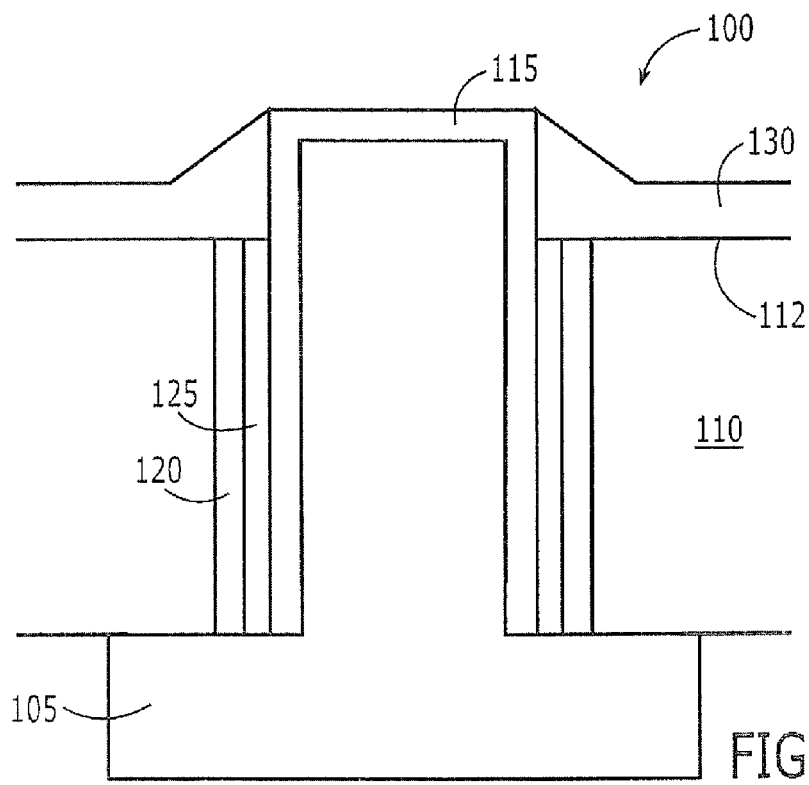
FIG. 1 is a cross sectional view that illustrates Through-Silicon-Via structures including conductive protective layers formed thereon in some embodiments according to the invention.

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions may be exaggerated for clarity. Like numbers refer to like elements throughout. As used herein the term "and/or" includes any and all combinations of one or more of the associated listed items and may be abbreviated as The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "having," "having," "includes," and/or "including" when used in this specification, specify the presence of stated features, regions, steps, operations, elements, and/or components, but do not preclude the presence or addition of one or more other features, regions, steps, operations, elements, components, and/or groups thereof.

It will be understood that when an element such as a layer or region is referred to as being "on" or extending "onto" another element (or variations thereof), it can be directly on or extend directly onto the other element or intervening elements may also be present. In contrast, when an element is referred to as being "directly on" or extending "directly onto" another element (or variations thereof), there are no intervening elements present. It will also be understood that when an element is referred to as being "connected" or "coupled" to another element (or variations thereof), it can be directly connected or coupled to the other element or intervening elements may be present. In contrast, when an element is referred to as being "directly connected" or "directly coupled" to another element (or variations thereof), there are no intervening elements present.

It will be understood that, although the terms first, second, etc. may be used herein to describe various elements, components, regions, layers and/or sections, these elements, materials, regions, layers and/or sections should not be limited by these terms. These terms are only used to distinguish one element, material, region, layer or section from another element, material, region, layer or section. Thus, a first element, material, region, layer or section discussed below could be termed a second element, material, region, layer or section without departing from the teachings of the present invention.

Relative terms, such as "lower", "back", and "upper" may be used herein to describe one element's relationship to another element as illustrated in the Figures. It will be understood that relative terms are intended to encompass different orientations of the device in addition to the orientation depicted in the Figures. For example, if the structure in the FIG. 1 is turned over, elements described as being on the "backside" of substrate would then be oriented on "upper" surface of the substrate. The exemplary term "upper", can therefore, encompasses both an orientation of "lower" and "upper," depending on the particular orientation of the figure. Similarly, if the structure in one of the figures is turned over, elements described as "below" or "beneath" other elements would then be oriented "above" the other elements. The exemplary terms "below" or "beneath" can, therefore, encompass both an orientation of above and below.

Embodiments of the present invention are described herein with reference to cross section and perspective illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated, typically, may be rounded. Thus, the regions illustrated in the figures are schematic in nature and their shapes are not intended to illustrate the precise shape of a region and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

FIG. 1 is a cross sectional view that illustrates a Through-Silicon-Via (TSV) structure 100 including a conductive via 105 that extends through a substrate 110 from an upper surface 111 to a back side surface 112. It will be understood that the terms "upper" and "back" sides are relative terms used herein for convenience to differentiate one surface from another and, further, can be generally referred to the surfaces that are processed by thinning or etching to expose a protruding portion of the conductive via 105 as part of the completed TSV structure 100.

A conductive protective layer 115 is formed on the conductive via and extends on the side wall thereof to a bottom region of the conductive via 105 proximate to the back side surface 112. A diffusion barrier layer 525 is formed on the conductive protective layer 115 and extends along the side wall of the conductive via 105 but does not extend on to the bottom region thereof. Still further, an insulating layer 120 is formed on the diffusion barrier layer 525 and also extends on the side wall on the conductive via 105 and further, does not extend to the bottom region of the conductive via 105. It will be understood that in some embodiments according to the invention, the diffusion barrier layer 525 and the insulating layer 120 can be combined into a single layer.

Still referring to FIG. 1 a separate polymer insulating layer 130 is formed on the back side surface 112 of the substrate 110 and extends on to the side walls of the conductive protective layer 115 proximate to the conductive via 105. Furthermore, the outer surface of the separate polymer insulating layer 130 has an inclined profile proximate to where the separate insulating layer 130 contacts the conductive protective layer 115.

In some embodiments according to the invention, the polymer insulating layer 130 has an average thickness, measure relative to the back side surface 112 at the conductive via that is greater than the thickness of the polymer insulating layer on the backside surface 112 spaced apart from the conductive via. In some embodiments according to the invention, the polymer insulating layer 130 is thinner on the conductive via side wall than when measured relative to the back side surface. In still other embodiments according to the invention, the polymer insulating layer 130 has a thickness of about 8 microns where the conductive via 105 protrudes from the back side surface 112. In still other embodiments according to the invention, the polymer insulating layer 130 has a thickness of about 1 to 2 microns and a position that is spaced apart from within the protruding portion of the conductive via 105. In some embodiments according to the invention, the polymer insulating layer 130 has a viscosity of about 290 cP, and a resistivity of about 10 to the 10-ohm-cm and modules of about 1 GPa to about 3 GPa.

In some embodiments according to the invention, the conductive protective layer 115 can be a metal that forms in inter-metallic compound with solder that can be used to electrically connect the TSV structure 100 to another TSV structure stacked on. In some embodiments according to the invention the conductive protective layer 115 can be a metal having a wet ability with solder that is greater than that of Td, Ti, TiM, Ta, and TaN. In some embodiments according to the invention, the conductive protective layer 115 can be Ni, and/or Co doped with a rare earth element or transition metal. In some embodiments according to the invention, the conductive protective layer 115 can be Ni doped with V and/or P or can be Co doped with W, P, Cr, and/or B.

Figure 6:
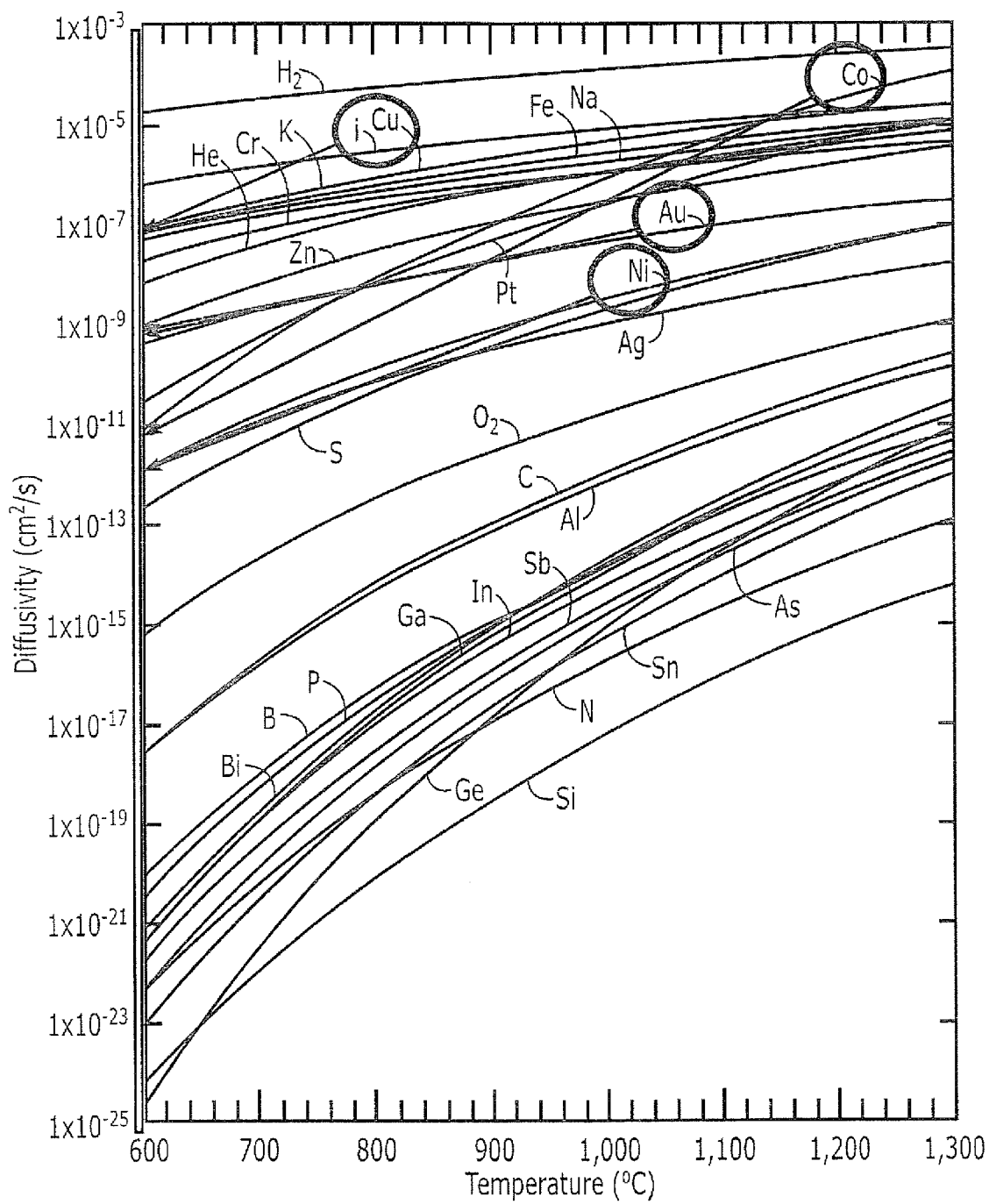
FIG. 6 is a graph that illustrates the comparative diffusivity of different metals over a range of temperatures.

In some embodiments according to the invention, the conductive protective layer 115 can be a metal having diffusivity into Si that is less than that of Au, Cu, and Ag into Si. Some exemplary metals according to the present invention are illustrated, for example, in FIG. 6.

In some embodiments according to the invention, the protruding portion of the conductive via 115 can protrude from the back side surface 112 by about 15 microns and can have a total height (i.e., from the portions of the conductive via 105 located on the upper surface 111 to the protruding portion) of about 45 microns and have a width of about 30 microns where the thickness of the substrate 110 is about 30 microns. Although not shown in FIG. 1, in some embodiments according to the invention, the conductive via 105 can be formed on a conductive pad located in the substrate 110 just beneath the portion of the conductive via 105 located on the upper surface 111. In still other embodiments according to the invention, the conductive via 105 can be formed offset from the conductive pad such that the conductive pad is located on the upper surface 111 spaced apart from the conductive via 105.

Figure 2:
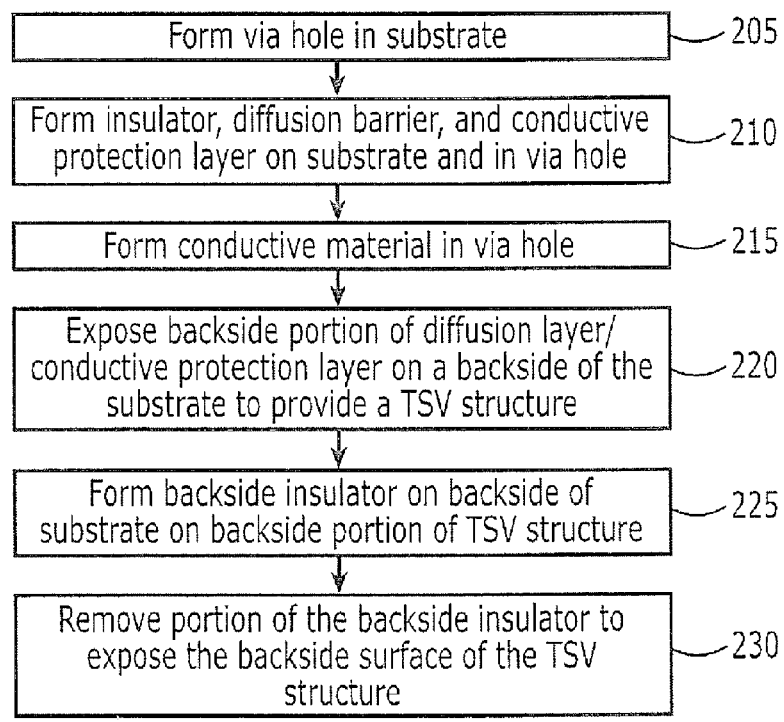
FIG. 2 is a flow chart that illustrates methods of forming Through-Silicon-Via structures in some embodiments according to the invention.
Figure 3:
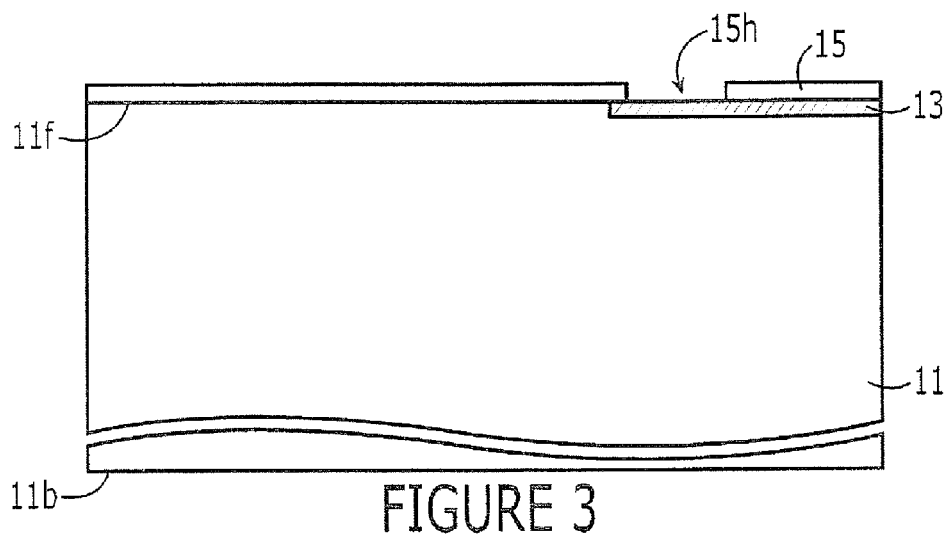
FIGS. 3-5 are cross sectional views that illustrate methods of forming TSV structures in some embodiments according to the invention.

FIG. 2 is a flow chart that illustrates methods of forming TSV structures in some embodiments according to the invention. According to FIG. 2 a hole is formed in a substrate (Block 505) and an insulator, diffusion barrier layer and conductive protective layer are formed on a substrate and in the hole (Block 210).

A conductive material is formed in the hole (Block 515), and the back side surface of the substrate is processed to expose the diffusion barrier layer, conductive protective layer on the back side of the substrate to provide a TSV structure (Block 220).

A polymer insulating layer is formed on the back side surface of the substrate and on the back side portion of the TSV structure (Block 225) and a portion of the polymer insulating layer is removed to expose the TSV structure on the back side surface (Block 330).

FIGS. 3-5 and 7-9 are cross sectional views that illustrate methods of forming TSV structures in some embodiments according to the invention. According to FIG. 3, a substrate 11 includes an upper surface 11F and a back side surface 11B and includes circuits from therein. Further, an insulating layer 15 is formed on the upper surface 11F to have hole 15H therein that exposes an electrical interconnect 13 that lies within the redistribution region in which a redistributed contact pad will be formed offset from the TSV structure formed in the substrate 11. In some embodiments according to the invention the interconnect 13 can be Cu, Al, W, Ti, Ta, which can be used to provide the contact pad. In some embodiments according to the invention, the insulating layer 15 can be a passivation layer formed of Si, O, Si, N, and/or Si ON.

Figure 4:
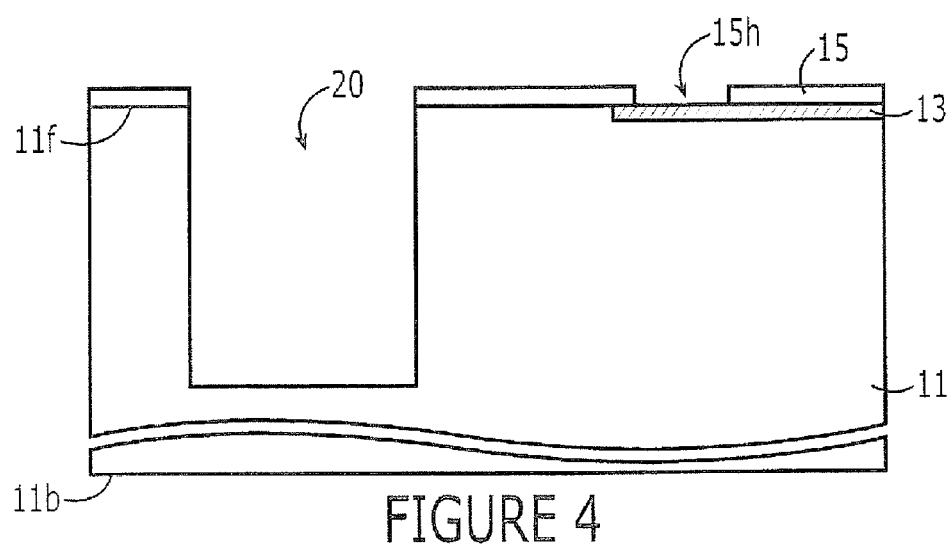

According to FIG. 4, a recess 20 is formed in the substrate 11 using dry etching or laser drilling. In some embodiments according to the invention, the recess 20 has a diameter of about 30 microns and a depth of about 30 to about 100 microns.

Figure 5:
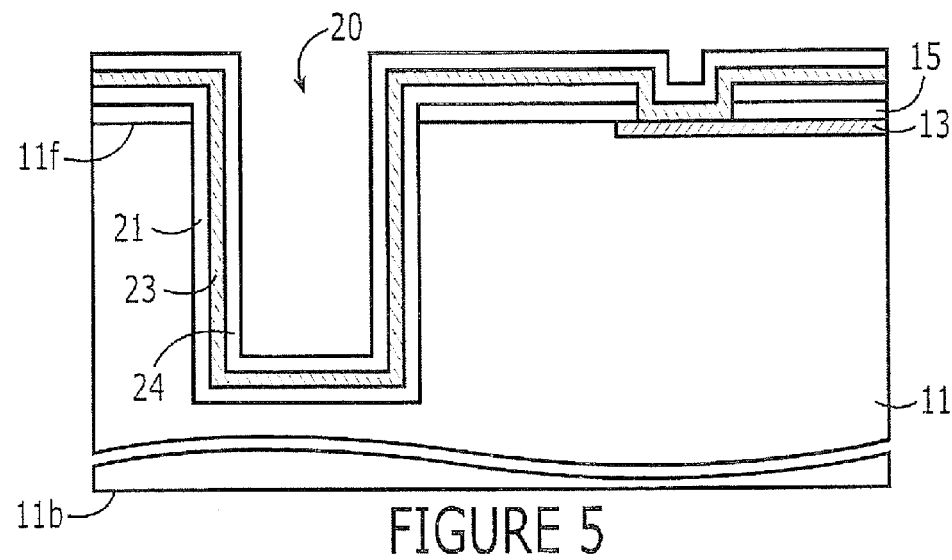

According to FIG. 5, an insulator layer 21 can be formed in the recess 20 and on the upper surface 11F. In some embodiments according to the invention, the insulator 21 is not deposited in or is removed from the opening 15H. A diffusion barrier layer 23 can be formed in the recess 20 on the insulator layer 21 as well as on the upper surface 11F. In some embodiments according to the invention, the diffusion barrier layer 23 can be Ti, TiN, TaN. In some embodiments according to the invention, the diffusion barrier layer 23 is also not deposited or is removed from the opening 15H wherein the contact pad will be formed. A conductive protective layer 24 is formed inside the recess 20 and on the upper surface 11F including in the opening 15H. In some embodiments according to the invention, the insulating layer 21 and diffusion barrier layer can be combined in a single layer having the properties of both. It will be further understood that the conductive protective layer 24 described above in reference to FIG. 5 can have the same properties as described above in reference to FIGS. 1 and 6.

Figure 7:
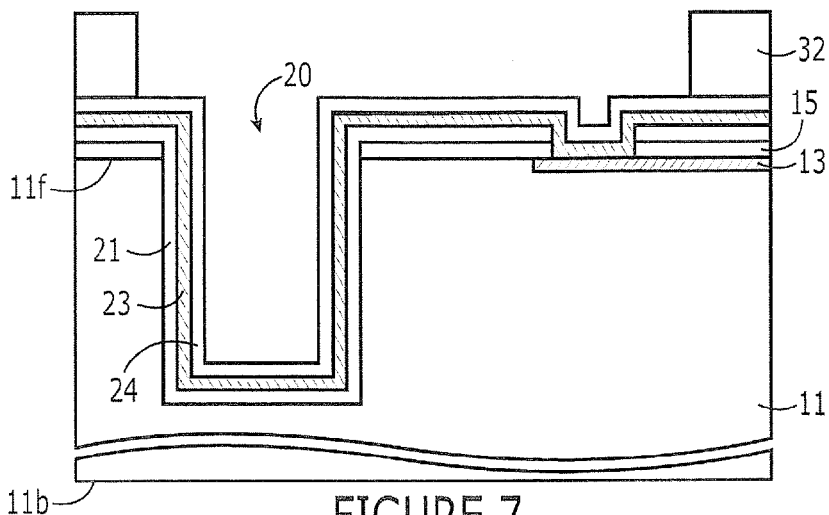
FIGS. 7-9 are cross sectional views that illustrate the formation of TSV structures in some embodiments according to the invention.

According to FIG. 7, a photo resist pattern 32 is formed on the conductive protective layer 24 so that an opening in the photo resist pattern 32 exposes the recess and a portion of the upper surface 11 that includes the redistribution area including the contact pad.

Figure 8:
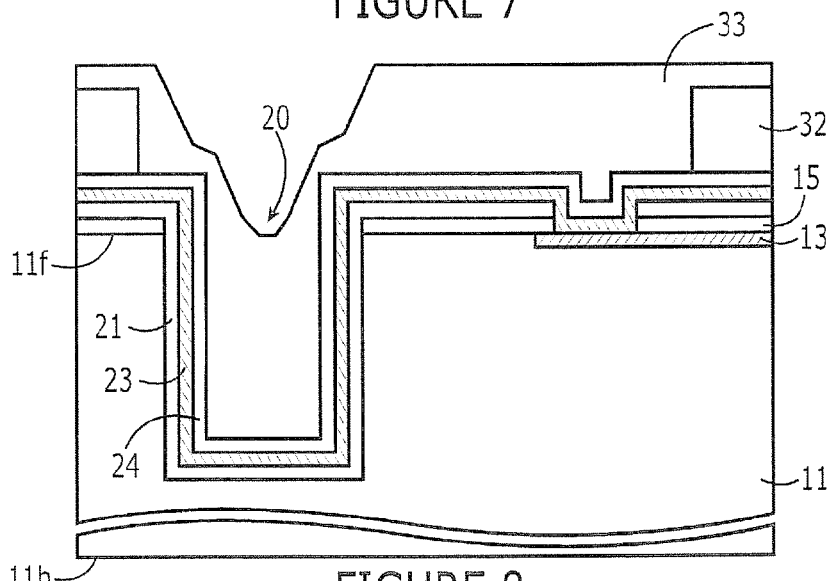

According to FIG. 8, a conductive material 25 is formed on the recess 20 and on the upper surface 11F. In some embodiments according to the invention, the conductive material can be Cu, W, Al, which is formed using electroless plating, CVD, or PVD.

Figure 9:
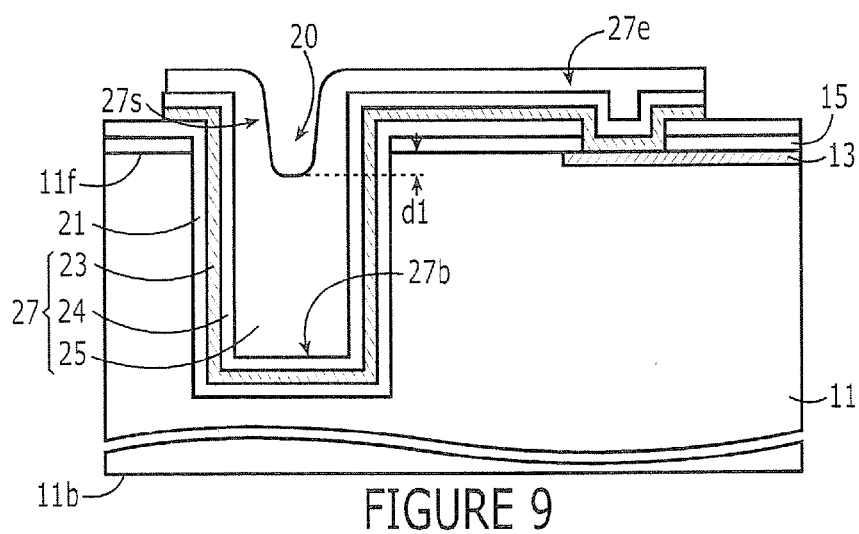

According to FIG. 9, the conductive material 25 can be used as a hard mask to remove the photo resist pattern 32 as well as portions of the conductive protective layer 24 and the diffusion barrier layer 23 laying beneath the photo resist pattern 32. Further, a groove 27S can be formed in the conductive material 33 that is self aligned to the center of the recess 20. In some embodiments according to the invention, a bottom of the groove of 27S can extend to a level into the recess that is beneath a level of the upper surface 11F by a distance d1. As further shown in FIG. 9, formation of the conductive material 25 in the recess 20 and on the redistributed pad can provide for the formation of a redistribution pattern 27E wherein the conductive material 25 is electrically connected to the interconnect 13 and the substrate 11.

Figure 10:
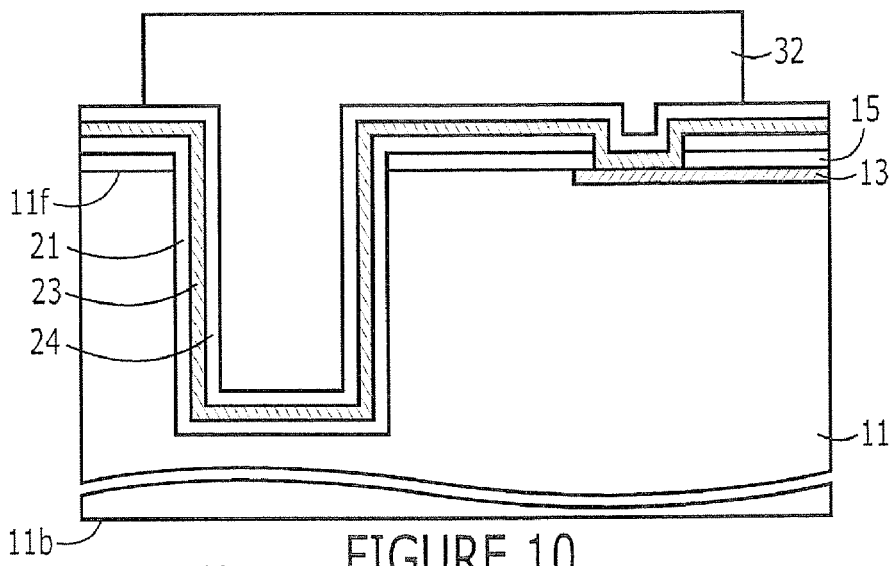
FIGS. 10-12 are cross sectional views that illustrate the formation of TSV structures in some embodiments according to the invention.
Figure 11:
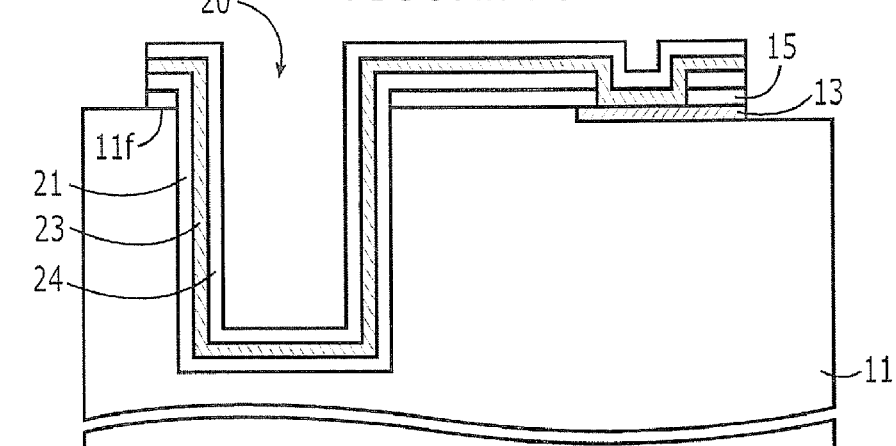
Figure 12:
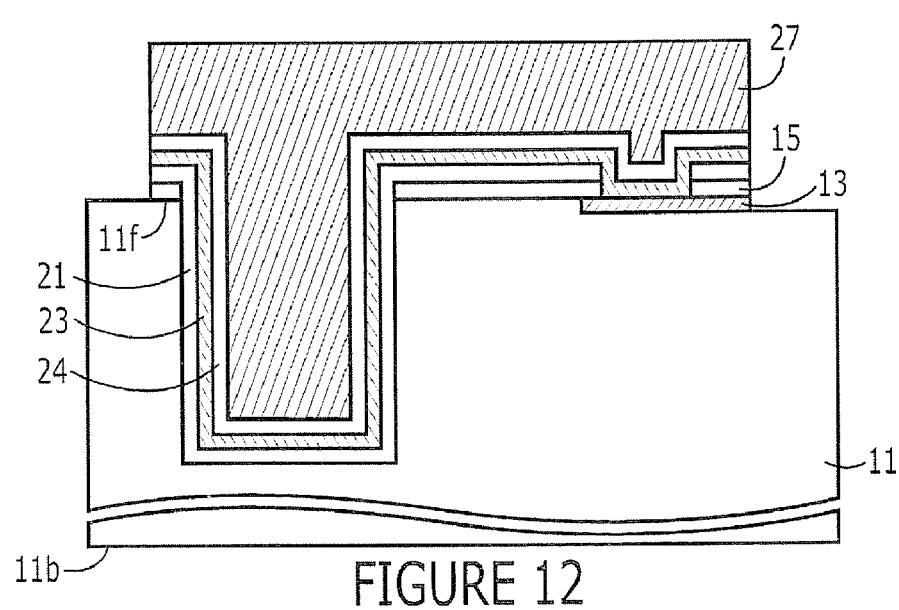
Figure 13:
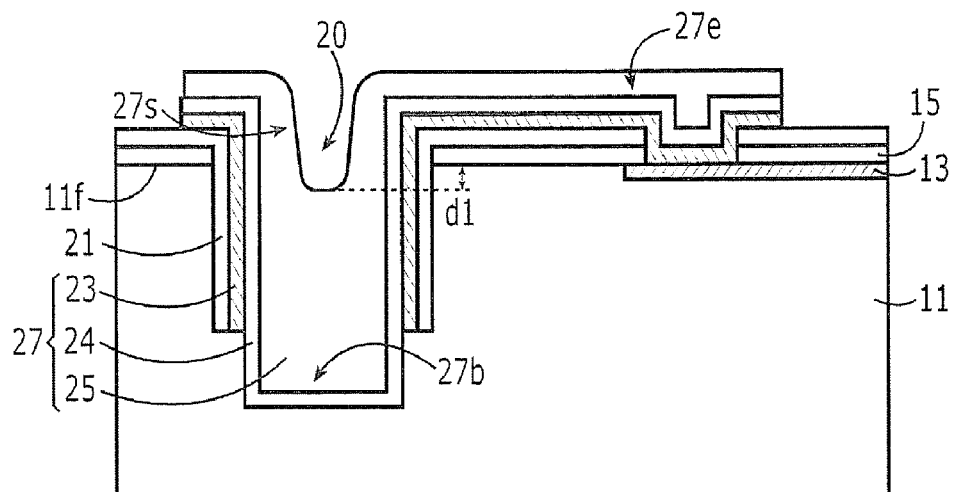
FIGS. 13-16 are cross sectional views that illustrate the formation of TSV structures in some embodiments according to the invention.

FIGS. 10-12 are cross sectional views that illustrate the formation of the conductive material 27 in the recess 20 and on the upper surface 11F according to other embodiments according to the invention.

According to FIG. 10, a photo resist pattern 32 is formed in the recess 20 and on the redistribution region including over the whole 15H. According to FIG. 11, the photo resist pattern 32 is used as an etch mask to remove the materials on the upper surface 11F located outside the photo resist pattern 32 to provide for the formation of the recess 20 and to expose a portion of the upper surface 11F including the redistribution region.

According to FIG. 12, the conductive material 27 is formed in the recess 20 and on the portions of the upper surface 11F on which on the conductive protective layer 24 remains. Accordingly, the conductive via can be formed in the recess along with the electrical connection to the interconnect 13 for the processing as described below.

FIGS. 13-16 are cross sectional views that illustrate formation of TSV structures by processing the back side surface 11B of the substrate 11 in some embodiments according to the invention. According to FIG. 13, the back side surface 11B is processed using grinding or a chemical policy process to reduce the thickness of the substrate 11 but still avoids the exposure of a bottom portion 27B of the conductive protective layer 24.

Figure 14:
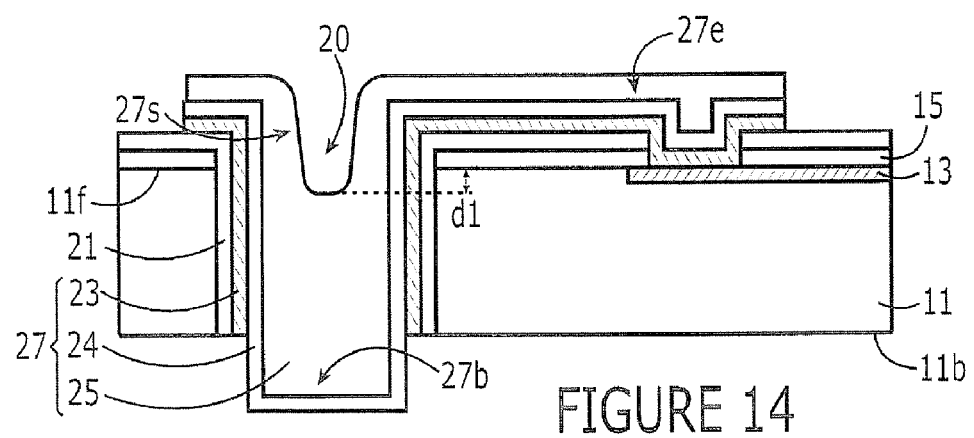

According to FIG. 14, a dry etch process is used to expose the bottom portion 24B of the conductive protective layer 24, which includes a protruding portion 25, which protrudes from the reduced back side surface 11B of the substrate 11. As further shown in FIG. 14, a portion of the insulator layer 21 and an underlying portion of the diffusion barrier layer 23 are removed where the protruding portion occurs.

Figure 15:
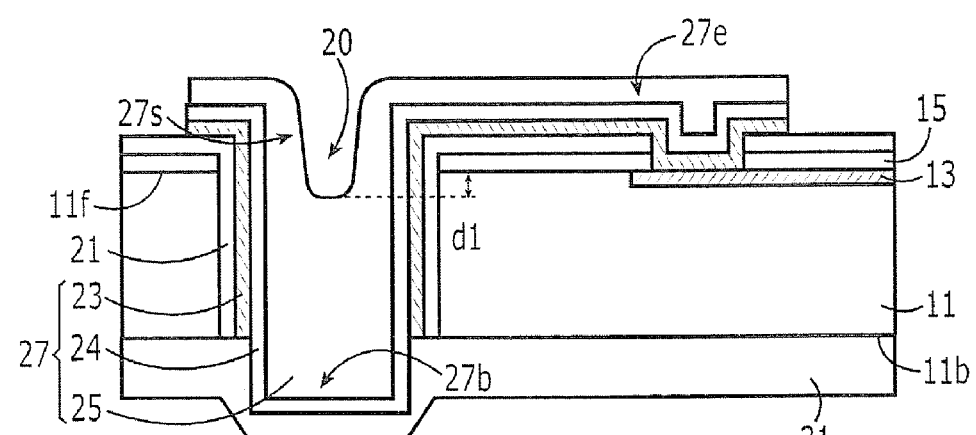

According to FIG. 15, a polymer insulating layer 31 is formed on the back side surface 11B including on the protruding portion of the via and particularly on the conductive protective layer 24. In some embodiments according to the invention, the polymer insulating layer 31 is applied to the back side surface 11B using a spin coating or a spraying method and, further, the polymer insulating layer can have an etch selectivity relative to the conductive protective layer 24. It will be understood that the polymer insulating layer 31 can help relieve stress caused by materials that are formed on or in the substrate to reduce the tendency of the substrate to warp. Accordingly, because the polymer insulating layer 31 is coated on to the back side surface 11B, the polymer insulating layer 31 can be a separate layer distinct from the substrate 11.

Figure 16:
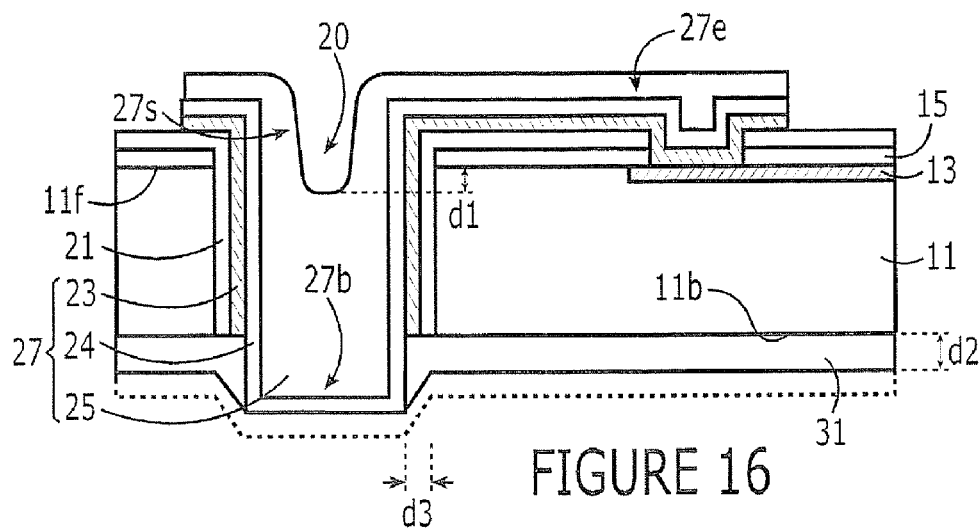

According to FIG. 16, the polymer insulating layer 31 is etched back to reduce the thickness thereof and the backside surface 11B as well as to expose the conductive protective layer through the polymer insulating layer 31. Furthermore, the etch back process can provide the polymer insulating layer 31 to have an incline profile at a point where the polymer insulating layer contacts the conductive protective layer 24. As shown in FIG. 16, the etch back process reduces the thickness of the polymer insulating layer 31 to a thickness D2 which is less than the distance which the protruding portion of the via protrudes from the back side surface 11B so that the protruding portion of the via protrudes through the polymer insulating layer 31. Furthermore, as shown in FIG. 10, in some embodiments according to the invention, a thickness D3 of the polymer insulating layer 31 on a side wall of the conductive protective layer 24 included in the protruding portion thereof is less than the thickness D2 of the polymer insulating layer 31 on the back side surface 11B. It will be further understood that the thickness D3 can be controlled by adjusting the viscosity of the polymer used to form the polymer insulating layer 31.

Figure 17:
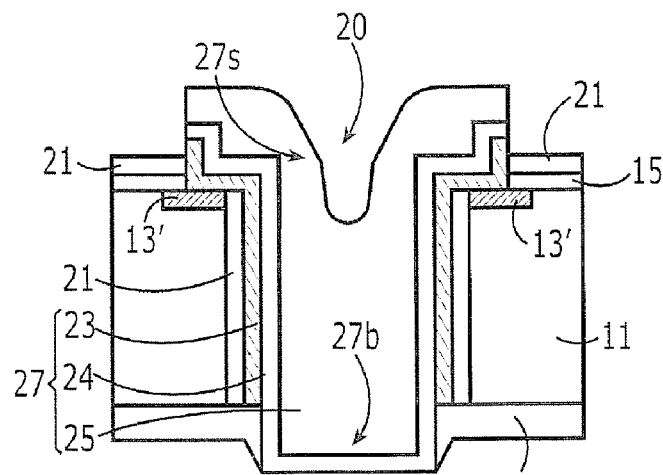
FIG. 17 is a cross sectional view that illustrates TSV structures including a groove formed on a contact pad in some embodiments according to the invention.

FIG. 17 is a cross sectional view that illustrates a TSV structure co-located with a contact pad 13' having portions located in the substrate 11 as shown.

Figure 18:
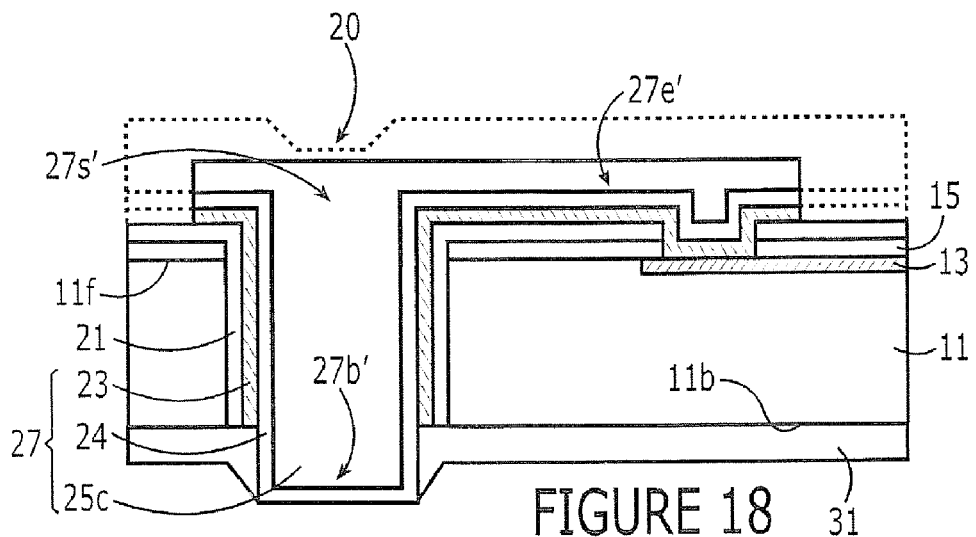
FIG. 18 is a cross sectional view that illustrates TSV structures having an upper planar surface formed offset from a contact pad in some embodiments according to the invention.
Figure 19:
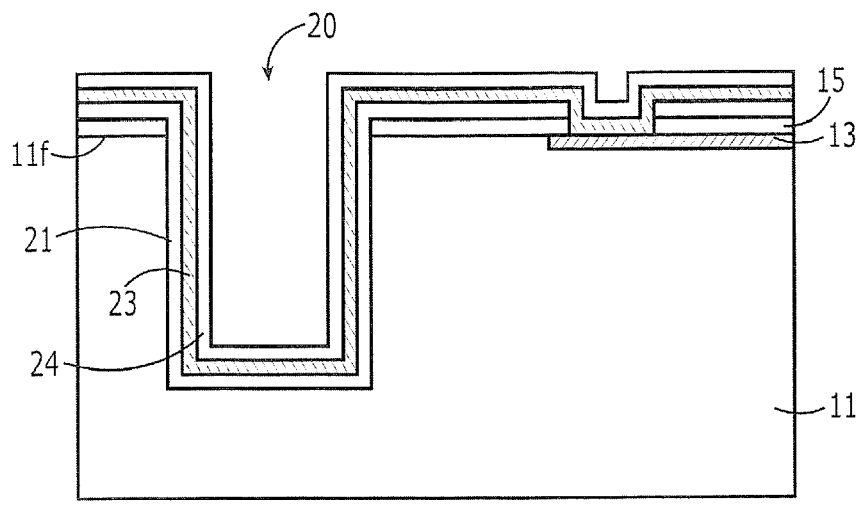
FIGS. 19-22 are cross sectional views that illustrate the formation of TSV structures in some embodiments according to the invention.
Figure 20:
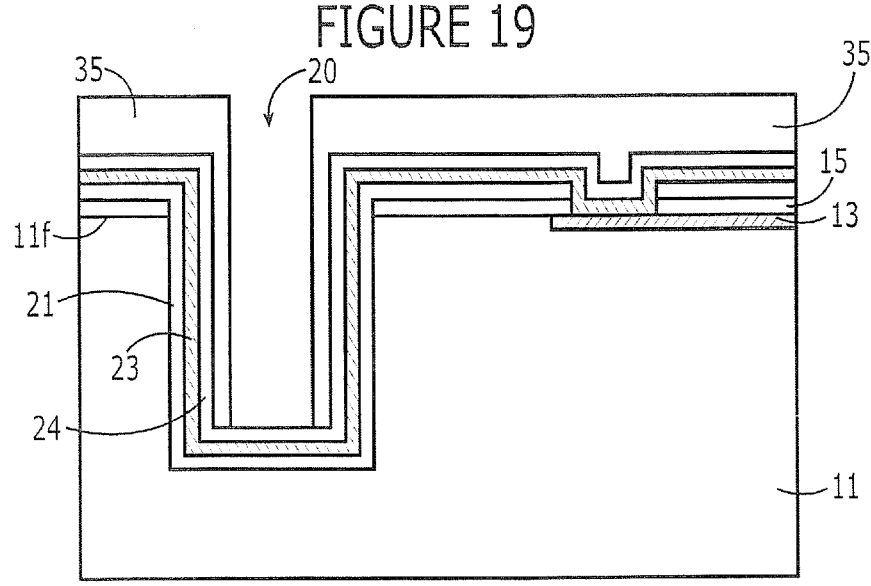

FIG. 18 is a cross sectional view is a view that illustrates TSV structures wherein an upper surface 27E' of the conductive via is plainer and does not include a groove 20.

FIGS. 19-22 are cross sectional views that illustrate methods of forming a TSV structure in some embodiments according to the invention. According to FIG. 19, an insulator layer 21, diffusion barrier layer 23, and a conductive protective layer 24 are formed in the recess 20 and on the upper surface 11F of the substrate 11 as described above. According to FIG. 20, a photo resist mask 35 is formed partially in the recess 20 as well as on the upper surface 11F of the substrate 11. In particular, a central portion of the recess 20 is left exposed by the photo resist pattern 35 that covers remaining portions of the recess 20 as well as those portions of the conductive protective 24 layer outside the recess.

Figure 21:
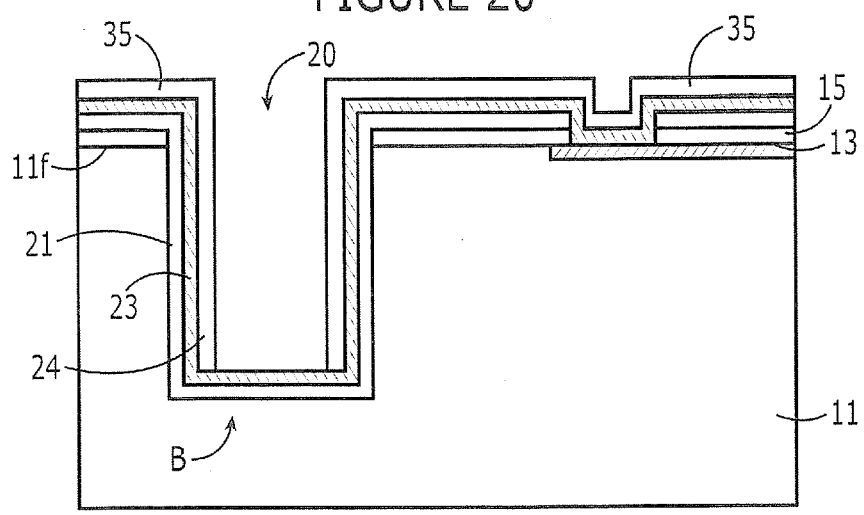

According to FIG. 21, the etching step is conducted using the photo resist pattern 35 to remove a portion of the conductive protective layer 24 located at the bottom of recess 20, which is exposed by the photo resist pattern 35. Subsequently, the photo resist pattern 35 is removed. Accordingly, the insulator layer 21 and the diffusion barrier layer 23 of the only remaining portions of the layers located at the bottom of the recess at region B.

Figure 22:
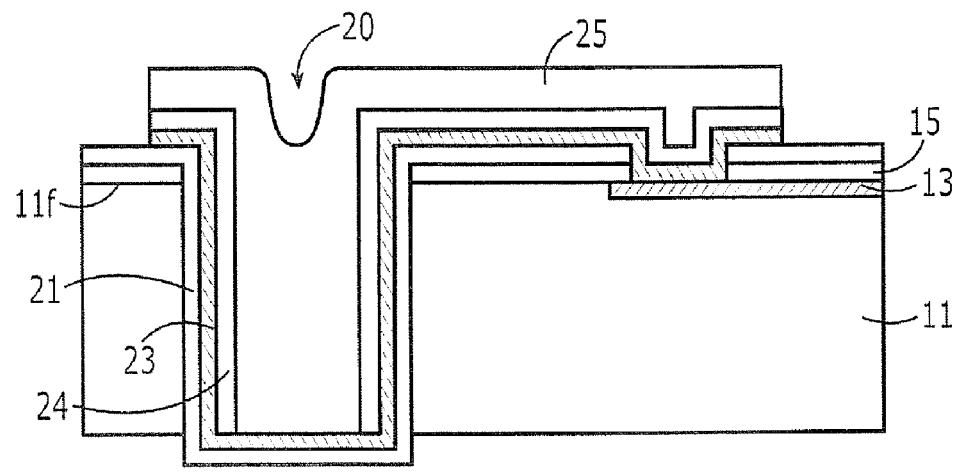

According to FIG. 22, a conductive material 25 is formed in the recess 20 as well as on the upper surface 11F from the substrate 11 including on the redistribution region to provide the contact pad as described above. It will be understood that the conductive material 25 deposited in the recess can be patterned to provide the TSV structure according to any of the approaches described herein.

Figure 23:
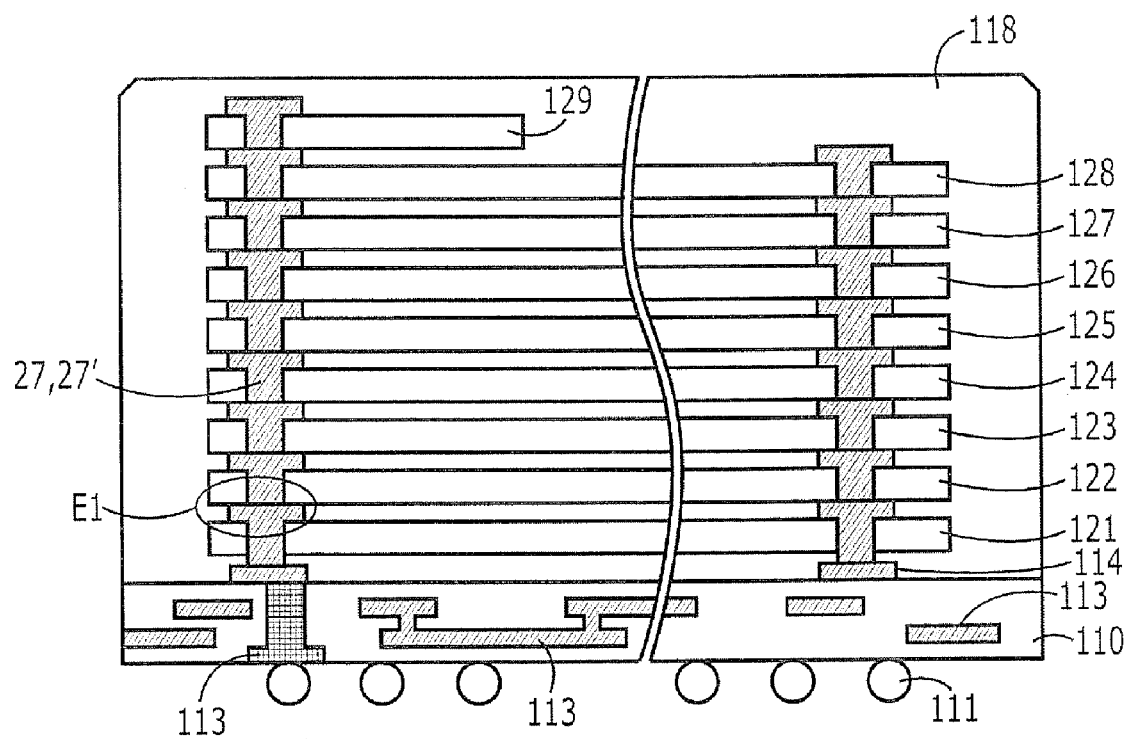
FIG. 23 is a cross sectional view that illustrates a schematic representation of a stack of substrates including respective TSV structures used to interconnect the substrates included in a package configured for interconnection to an under lying structure using solder bumps in some embodiments according to the invention.

FIG. 23 is the cross sectional schematic view of a package 118 including a three dimensional stack of substrate 121-128 connected to one another by TSV structures 27 on a substrate 110. It will be further understood that the three dimensional stack can include a substrate 129 including logic devices also connected to the 3-D stack using TSV structures in some embodiments according to the invention. Further, the package 118 can be conducted to other devices or a substrate by solder bumps 111. As further shown in FIG. 23, the substrate 110 can include interconnect 113 used to provide signals to-from the three dimensional stacks of substrates and the solder bumps 111.

Figure 24:
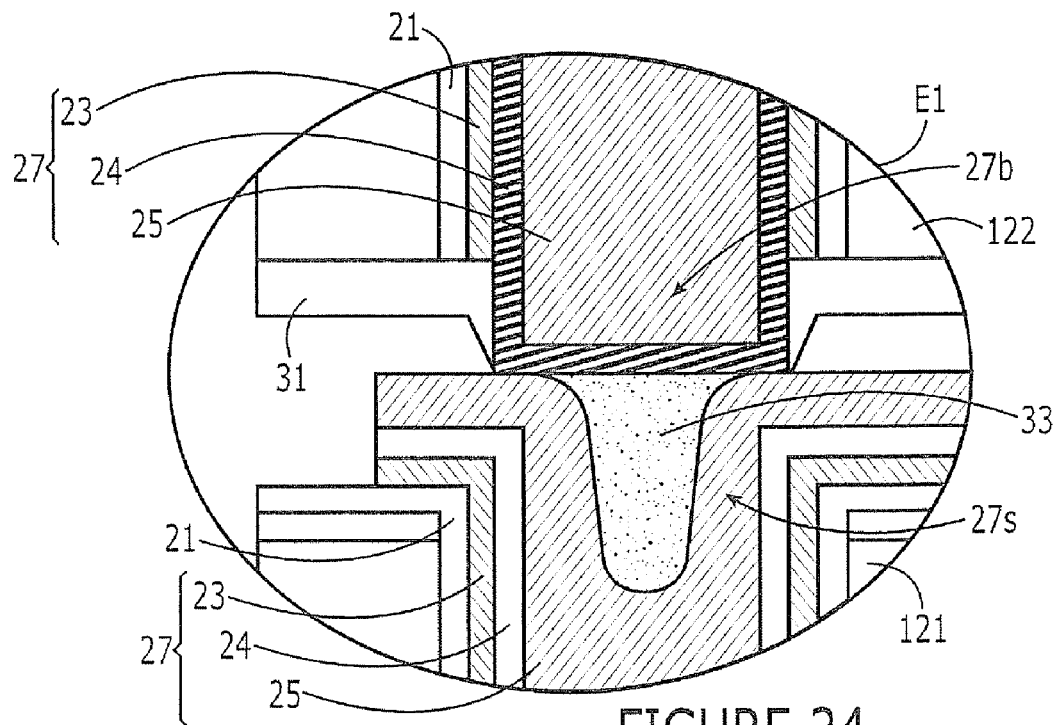
FIG. 24 is a cross sectional view that illustrates immediately adjacent substrates in the stack, electrically connected to one another by respective TSV structures wherein at least one of the TSV structures includes a groove filled with solder to define a coplanar surface with an upper surface at the TSV structure having a groove formed therein in some embodiments according to the invention.

FIG. 24 is a cross sectional view that illustrates TSV structures included in the three dimensional stack of substrates and the package 118 highlighted at region E1 shown in FIG. 23 in some embodiments according to the invention. According to FIG. 24, the groove in the upper surface of the conductive material includes solder 33 which is used to electrically connect the underlying TSV structure to another TSV structure located directly above the groove. It will be understood that the solder 33 is limited to being within the groove and does not extend on to the upper surface of the conductive material.

Figure 25:
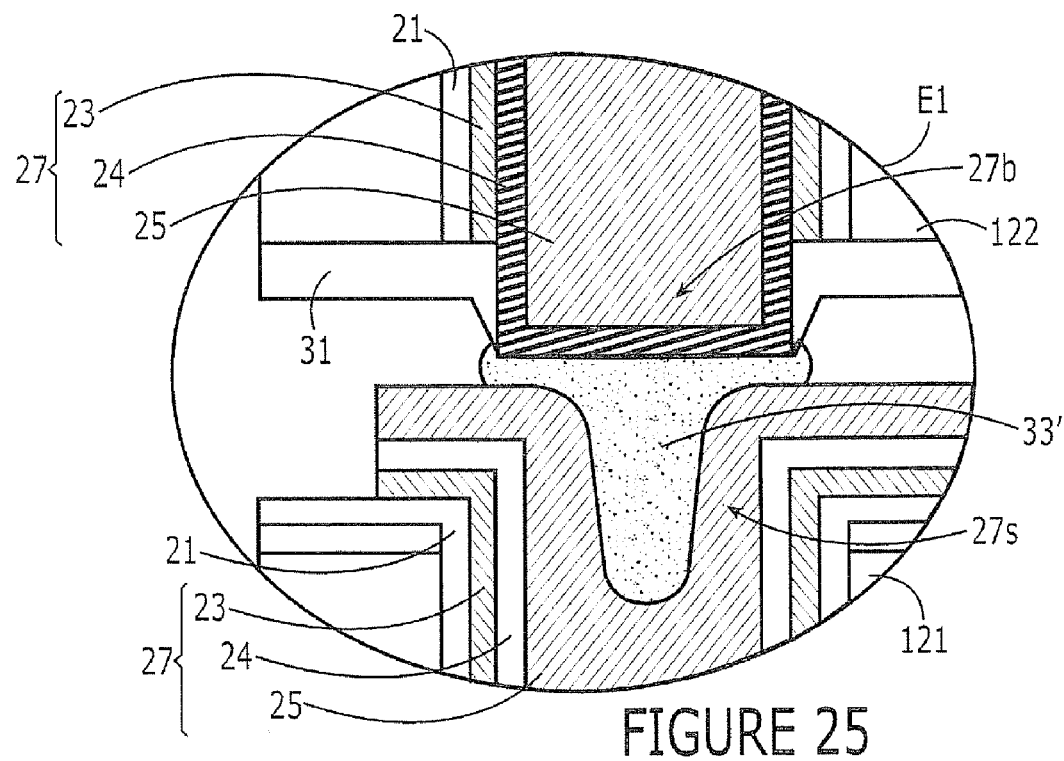
FIG. 25 is a cross sectional view that illustrates immediately adjacent substrates in a three dimensional stack electrically coupled to one another by respective TSV structures wherein at least one of the structures includes a groove filled with solder that extends outside the groove in some embodiments according to the invention.

FIG. 25 is a cross sectional view that illustrates alternative embodiments of interconnected TSV structures included in the package 118 shown in FIG. 23 in some embodiments according to the invention. In particular, solder 33, used to interconnect the two immediately adjacent TSV structures is not limited to within the groove and rather extends on to at least a portion of the upper surface of the conductive material used to form the lower TSV structure.

Figure 26:
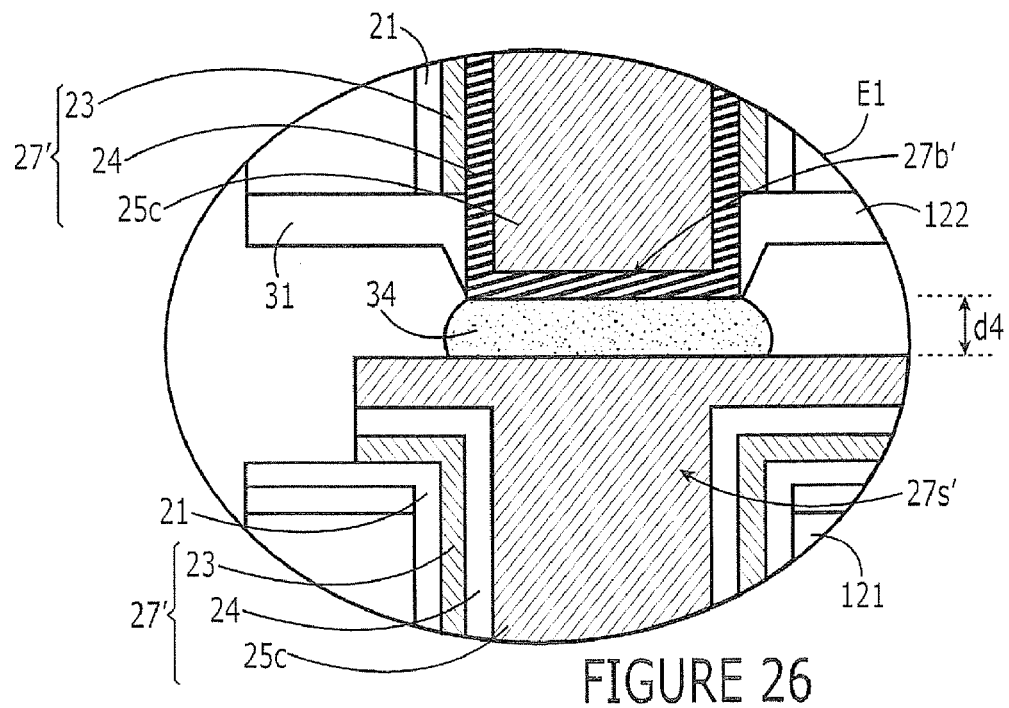
FIG. 26 is a cross sectional view that illustrates immediately adjacent substrates in the three dimensional stack electrically connected to one another by respective TSV structures wherein solder is formed on the planar surface of at least one of the TSV structures used to electrically connect to the immediately adjacent TSV structure in some embodiments according to the invention.

FIG. 26 is cross sectional view that illustrates a conventional structure wherein a solder 34 used to electrically connect the upper and lower TSV structures may provide additional thickness D4 to the overall height of the three dimensional stack.

Figure 27:
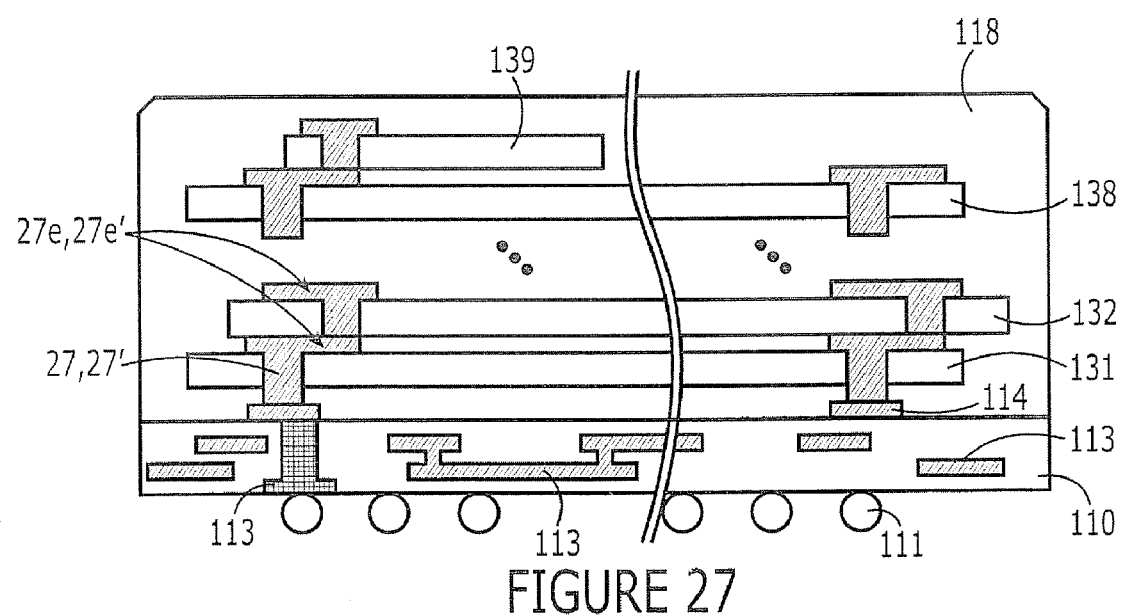
FIG. 27 is a cross sectional schematic representation of a three dimensional stacked structure including TSVs in a zigzag pattern utilizing contact pads offset from the TSV structures in some embodiments according to the invention.

FIG. 27 is a cross sectional schematic view that illustrate a three dimensional stack of substrates including TSV structures used for electrical connections between the three dimensionally stacked substrates. In particular, the TSV structures can be configured with the redistributed region including the pads which can be electrically coupled to TSV structures located in the immediately adjacent substrates in the three dimensional stack. Furthermore, the redistribution regions and TSV structures associated therewith can be arranged to make zigzag pattern as shown. It will be understood that the arrangement shown in FIG. 27 can be utilized to provide a three dimensional stack of substrates including memory devices as well as a logic chip 139 located within the three dimensional stack.

Figure 28:
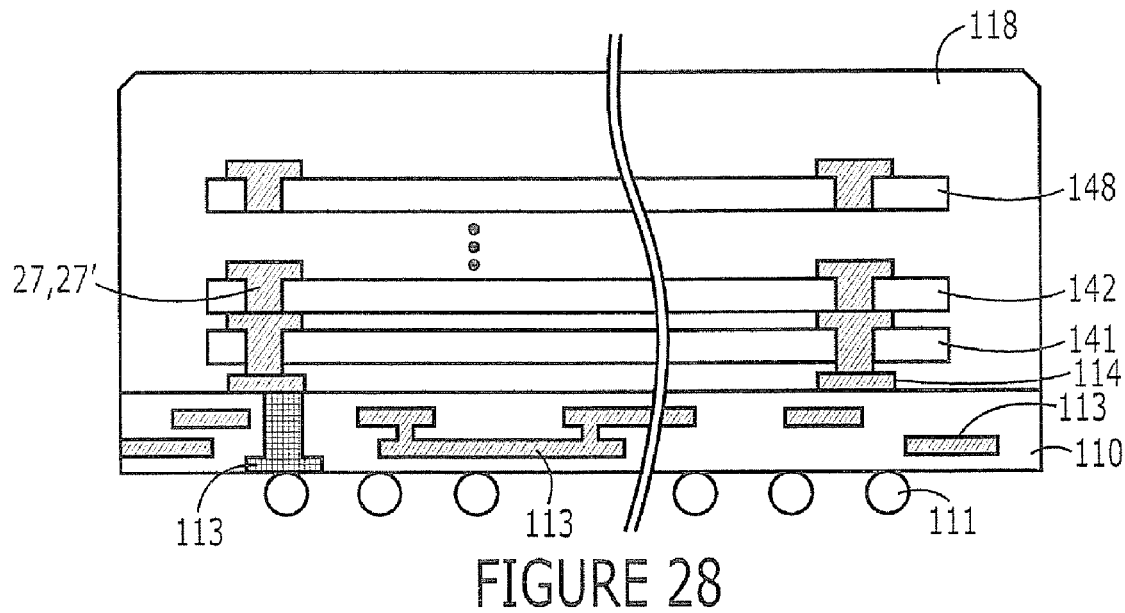
FIG. 28 is a cross sectional schematic representation of a three dimensional stacked structure including TSV structures in an aligned pattern including contact pads formed within the TSV structures in some embodiments according to the invention.

FIG. 28 is a cross sectional schematic view of a package 118 which would include the three dimensional stack of substrate electrically connected to one another by TSV structures in some embodiments according to the invention. In contrast, the two embodiments illustrated in FIG. 27, the arrangement illustrated in FIG. 28 provide parallel interconnection of the TSV structures utilizing the contact pad located within the TSV structures rather than offset therefrom as shown in FIG. 27. Furthermore, as shown in FIG. 28 the three dimensional stack of substrates can be used to implement memory devices within the package which may also exclude a logic device 139 in comparison to that shown in FIG. 27.

Figure 29:
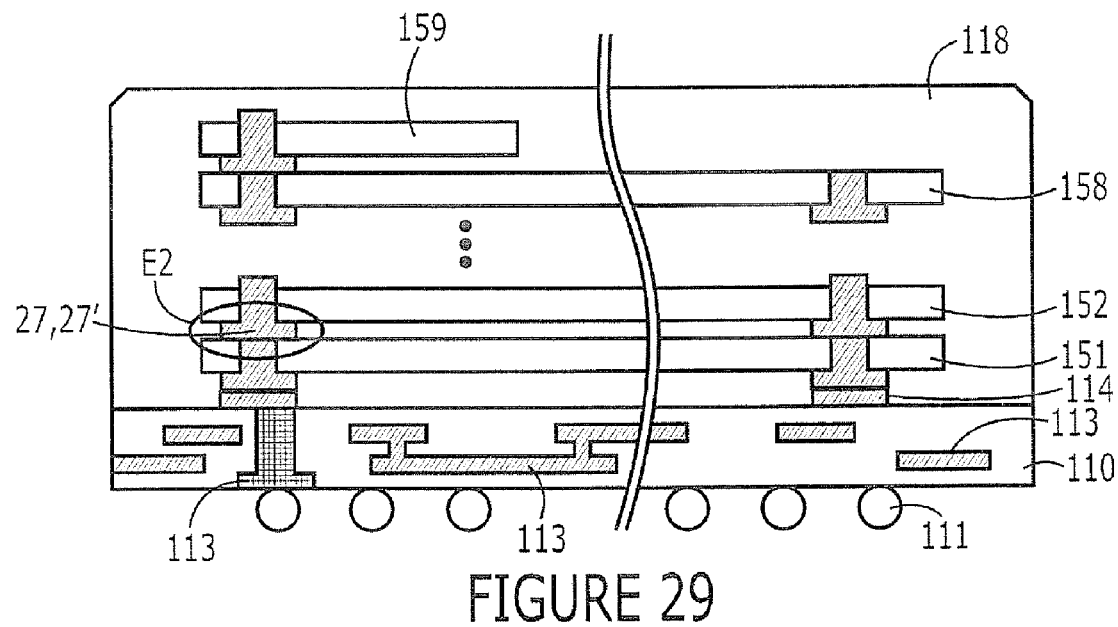
FIG. 29 is a cross sectional schematic representation of a three dimensional structure including inverted TSV structures in some embodiments according to the invention.

FIG. 29 is a cross sectional schematic view that illustrates a three dimensional stack of substrates electrically interconnected with one another using TSV structures in some embodiments according to the invention. As further shown in FIG. 29, a logic chip 159 can be included within the three dimensional stack of substrates. As further illustrated in FIG. 29, the TSV structures can be coupled to one another using an inverted TSV structure.

Figure 30:
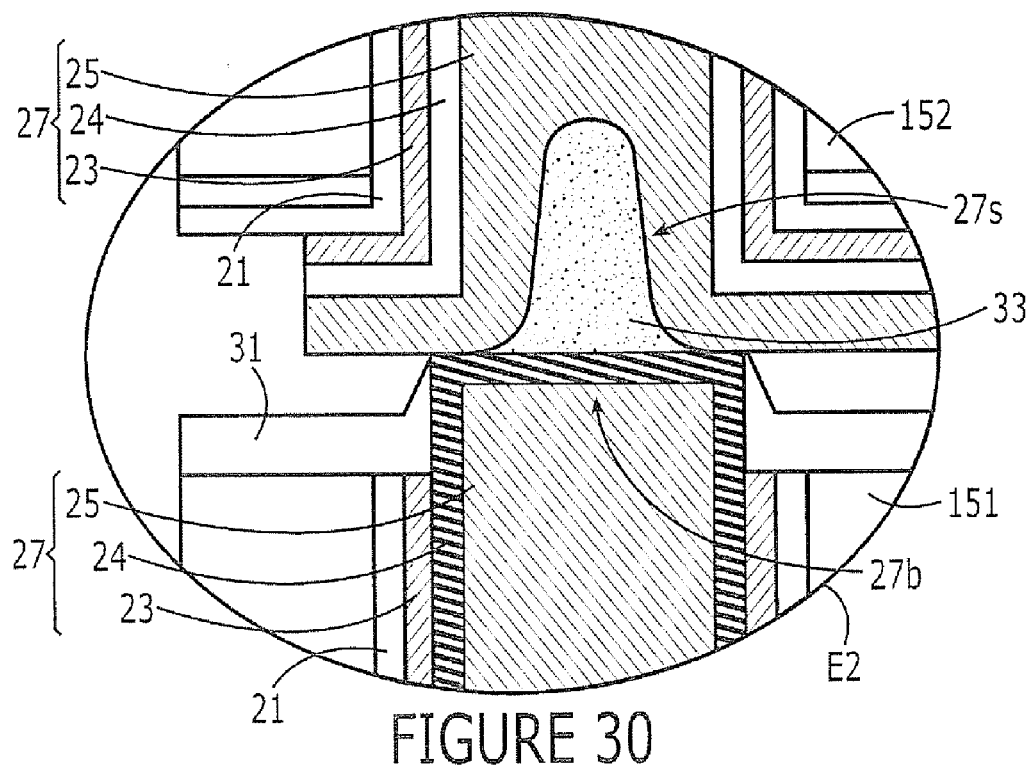
FIG. 30 is a cross sectional view that illustrates the immediately adjacent substrates within three dimensional stack structure of FIG. 29 wherein at least one of the TSV structures includes a groove therein filled with solder to define a planar surface of the TSV structure electrically connected to the adjacent TSV structure in some embodiments according to the invention.
Figure 31:
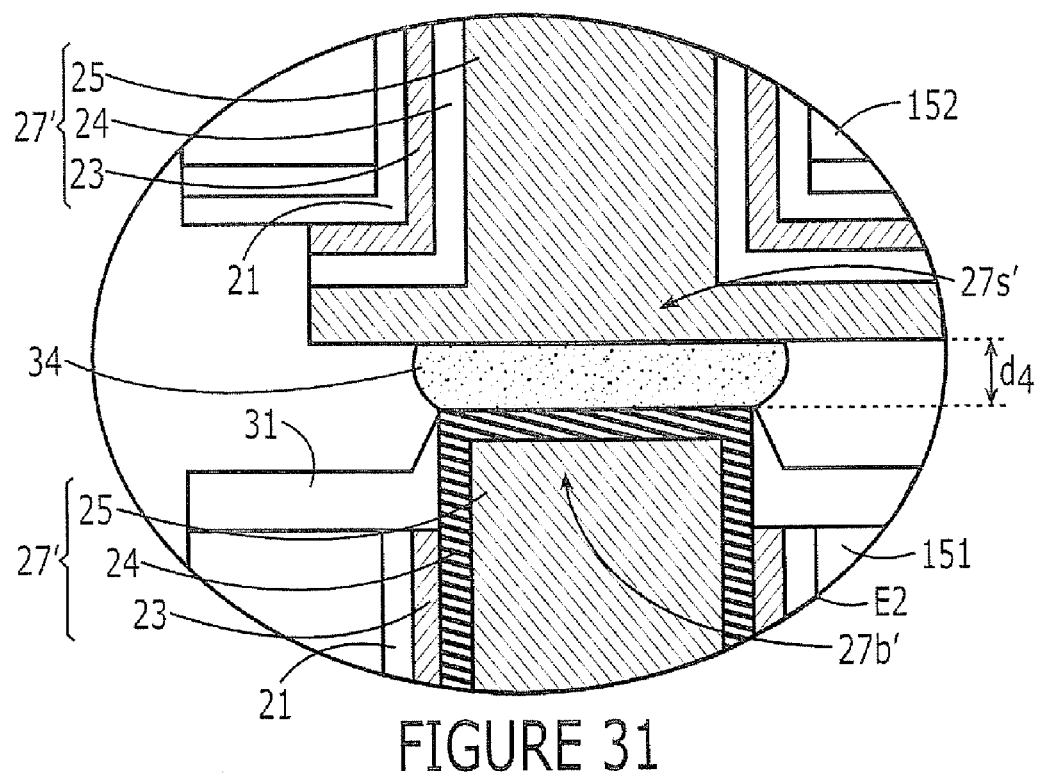
FIG. 31 is a cross sectional view that illustrates immediately adjacent substrates within the three dimensionally stacked structures shown in FIG. 29 wherein the immediately adjacent TSV structures are electrically connected by solder therebetween formed one a planar surface of at least one of the TSV structures in some embodiments according to the invention.

FIG. 30 is a cross sectional view that illustrates the adjacent TSV structures within the three dimensional stack of substrates shown at region E1 in FIG. 29. According to FIG. 30, solder 33 located in the groove of the upper TSV structure is fully confined therein and does not extend out of the groove.

Figure 32:
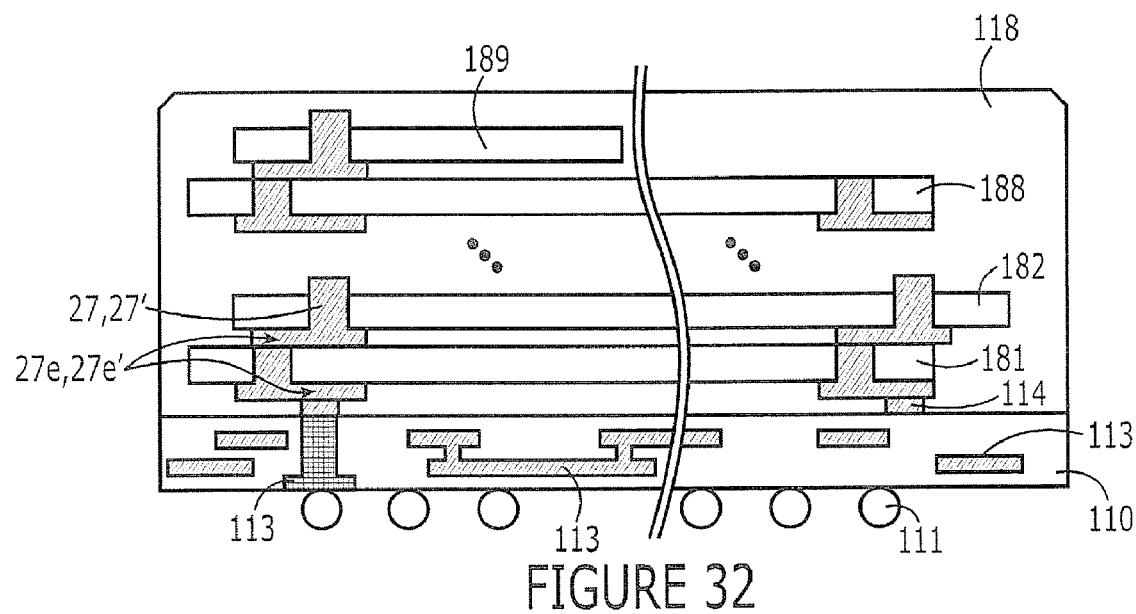
FIG. 32 is a cross sectional schematic view that illustrates a three dimensionally stacked structure including TSV structures used to interconnect substrates therein arranged to make a zigzag pattern wherein the TSV structures include contact pads that are offset from the TSV structures in some embodiments according to the invention.

FIG. 32 is a cross sectional schematic representation of a package 118 including a three dimensional stack of substrate electrically connected to one another by TSV structures arranged in a zigzag pattern in some embodiments according to the invention.

Figure 33:
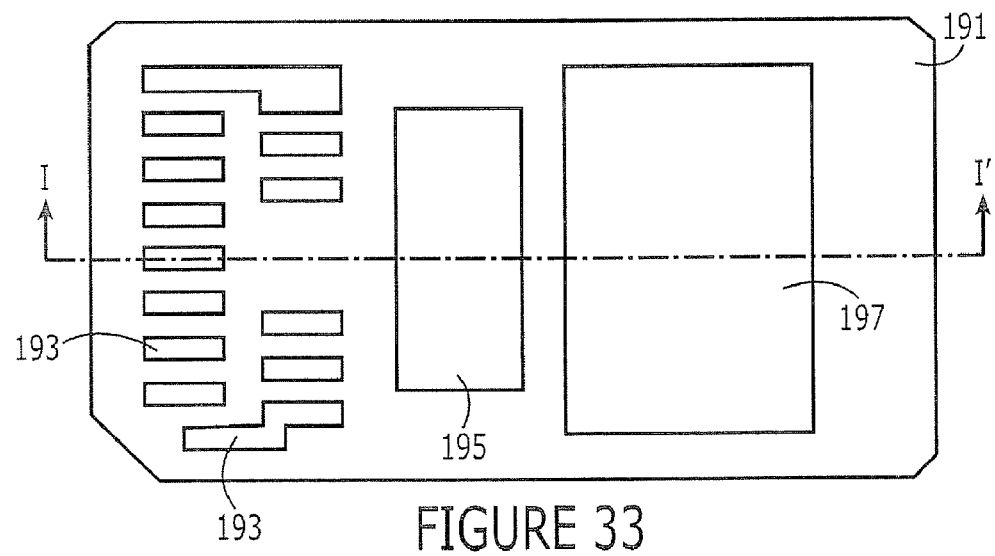
FIG. 33 is a plan schematic view of a standard form factor memory card in some embodiments according to the invention.

FIG. 33 is a plan view of a memory card formatted to a standard form-factor card including non-volatile memory, controller chip 195, and external terminals 193 used to interconnect the memory card to a socket in some embodiments according to the invention.

Figure 34:
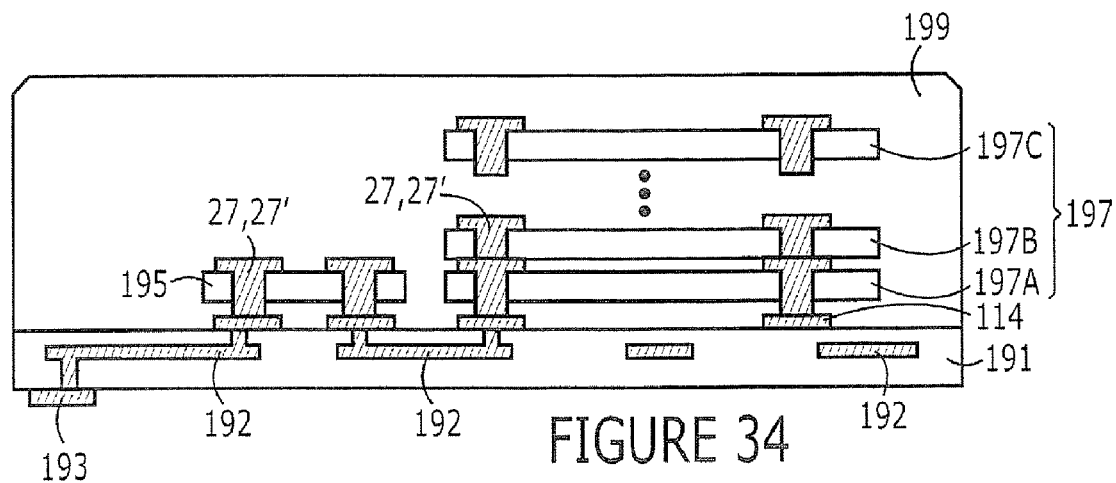
FIG. 34 is a cross sectional view taken along the cross sectional line I-I' shown in FIG. 33 that illustrates a three dimensionally stacked structure used to implement the memory card as part of the stack and further a controller chip associated therewith in some embodiments according to the invention.

FIG. 34 is a cross sectional schematic view along cross section I-I' shown in FIG. 33 in some embodiments according to the invention. In particular, a substrate within the card 199 includes interconnect 192 that is connected to the external terminals 193. The interconnect 192 also electrically connects to substrates for the controller chip 195 as well as the substrates within the three dimensional stack of substrates used to implement the non-volatile memory within the memory card, According to FIG. 34, both the controller chip 195 and the substrates within the three dimensional stack used to implement the non-volatile memory are electrically connected to one another using TSV structures where the contact pads are included within the TSV structures themselves as illustrated above, for example, in FIG. 17.

Figure 35:
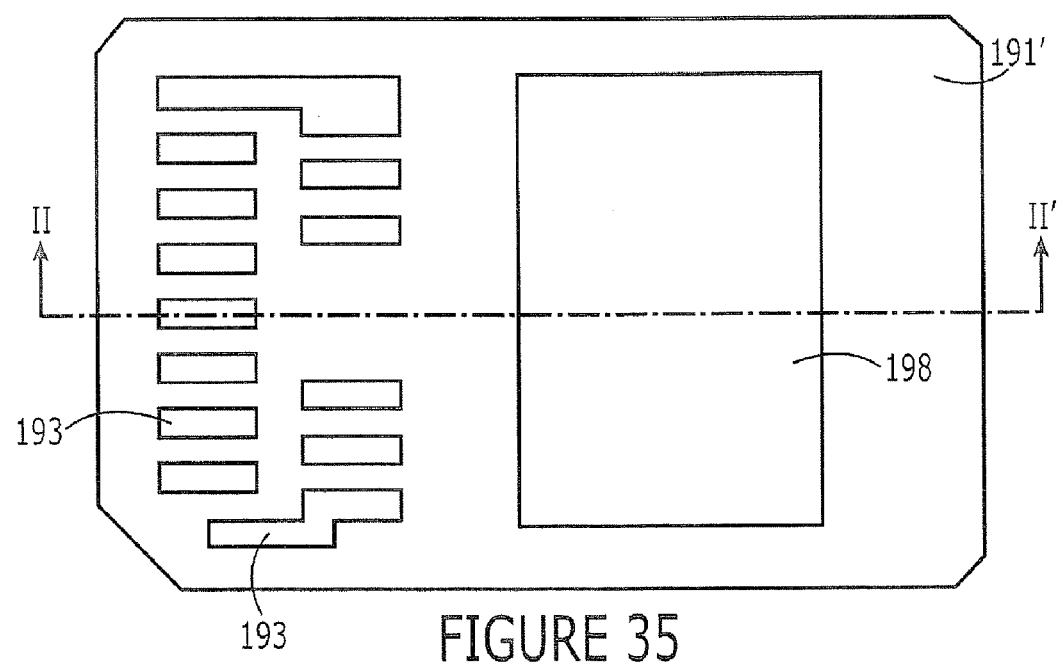
FIG. 35 is a plan view of a standard form factor memory card included in a three dimensionally stacked structure including TSV structures in some embodiments according to the invention.

FIG. 35 is a plan view of a non-volatile memory implemented according to a standard form factor including a non-volatile memory 198 and external terminals 193 in some embodiments according to the invention.

Figure 36:
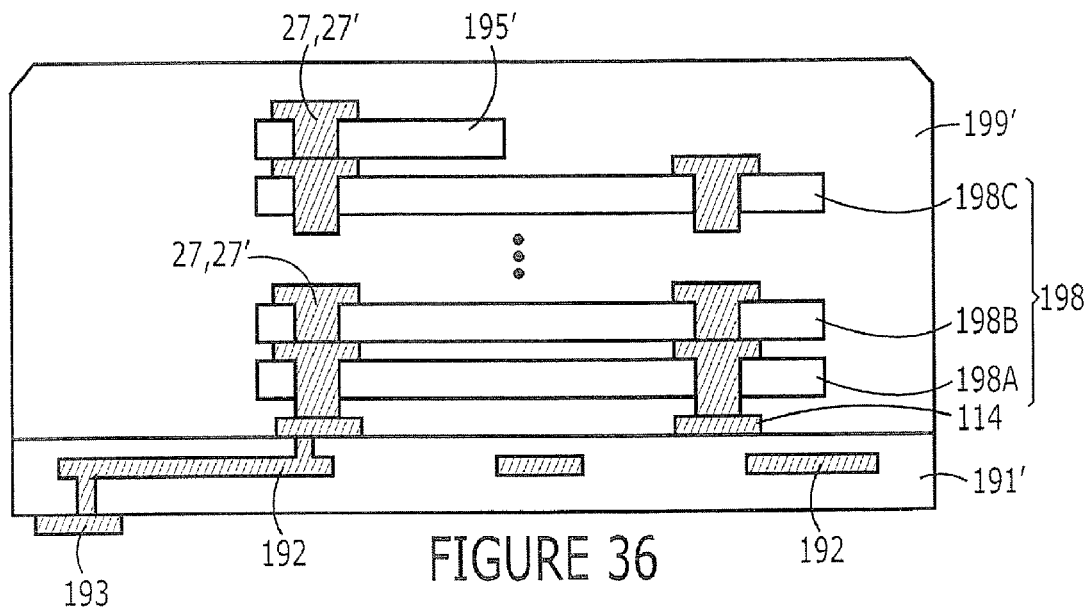
FIG. 36 is a cross sectional schematic view taken along cross sectional line II-II' shown in FIG. 35 wherein a three dimensionally stacked structure including TSV structures are used to implement non-volatile memory with TSV structures including contact pads formed therein used to electrically connect the substrates in the stack to one another in some embodiments according to the invention.

FIG. 36 is a cross sectional schematic view along cross section II-II prime shown in FIG. 35. According to FIG. 36, a three dimensional stack of substrates is used to implement the non-volatile memory 198 and further can include a substrate 195 prime used to implement the controller. Further, the substrate 191 prime includes electrical interconnect 192 that is used to electrically connect the external terminals 193 to the substrates within the three dimensional stack. Furthermore, the three dimensional stack substrates are interconnected by TSV structures having contact pads formed therein as shown for example above in FIG. 17.

Figure 37:
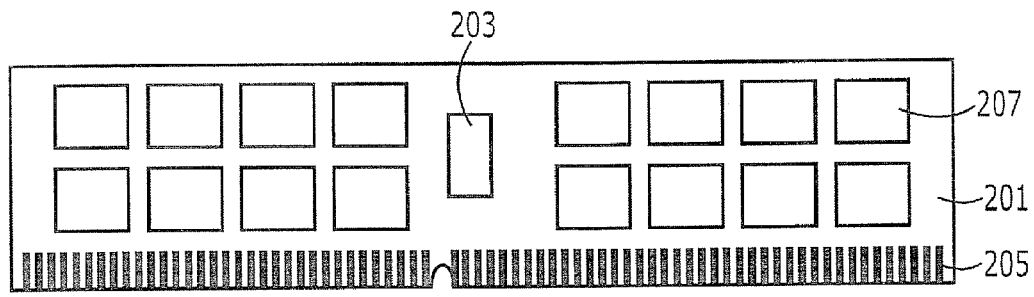
FIG. 37 is schematic representation of a memory module including memory devices with TSV structures therein in some embodiments according to the invention.

FIG. 37 is a schematic representation of a memory module including packages 207 including memory devices on a substrate 201 wherein 10 terminals 205 are used to connect the memories within the packages 207 to devices located outside the memory module. Furthermore, the memory module can include a controller unit 203 to coordinate operations of the memory devices included on the module. It will be understood that memory devices included within the packages 207 can be formed with TSV structures as described herein in some embodiments according to the invention.

Figure 38:
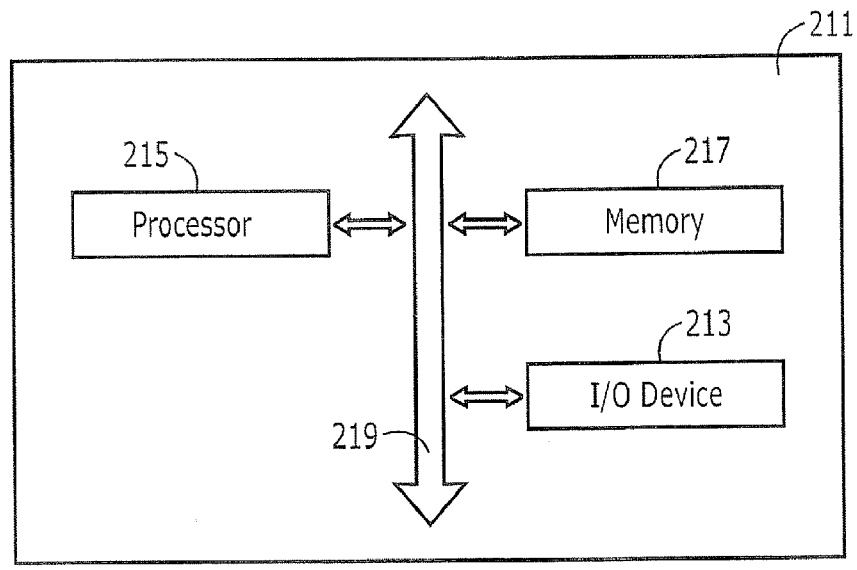
FIG. 38 is a block diagram that illustrates an electronic system including various devices including TSV structures in some embodiments according to the invention.

FIG. 38 is a block diagram of an electronic system that includes a processor 215 coupled to a memory 217 and an IO device 213 by a bus 219. It will be understood that the devices used to implement the processor 215, the memory devices 217 and the IR devices 213 can all be implemented using TSV structures in some embodiments according to the invention.

Many alterations and modifications may be made by those having ordinary skill in the art, given the benefit of present disclosure, without departing from the spirit and scope of the invention. Therefore, it must be understood that the illustrated embodiments have been set forth only for the purposes of example, and that it should not be taken as limiting the invention as defined by the following claims. The following claims are, therefore, to be read to include not only the combination of elements which are literally set forth but all equivalent elements for performing substantially the same function in substantially the same way to obtain substantially the same result. The claims are thus to be understood to include what is specifically illustrated and described above, what is conceptually equivalent, and also what incorporates the essential idea of the invention.

What is claimed is:

1. A Through-Silicon-Via (TSV) structure comprising:
   a conductive via through a substrate extending from an upper surface of the substrate to a backside surface of the substrate opposite the upper surface;
   a conductive protective layer comprising Nickel (Ni) and/or Cobalt (Co) at a bottom of the conductive via;
   a polymer insulating layer on the backside surface of the substrate in contact with the conductive protective layer;
   wherein an outer surface of the polymer insulating layer has an inclined profile proximate to where a protruding portion of the conductive via protrudes from the backside surface of the substrate and contacts the polymer insulating layer; and
   wherein the polymer insulating layer has a viscosity comprising about 290 cP, a resistivity of about $10^{10}$ ohm-cm, and a modulus of about 1 GPa to about 3 GPa.

2. A structure according to claim 1 wherein the conductive via includes a groove in an upper surface thereof facing away from the substrate and configured to extend into the via to beneath the upper surface of the substrate.

3. A structure according to claim 1 wherein the conductive via includes a groove in an upper surface thereof facing away from the substrate and extending beneath the upper surface of the substrate, the structure further comprising:
   solder in the groove electrically connected to another TSV structure above the conductive via.

4. A structure according to claim 1 wherein the polymer insulating layer comprises a thickness of about 1 to about 2 micrometers at a first location spaced apart from where the protruding portion protrudes from the backside surface.

5. A structure according to claim 1 wherein the polymer insulating layer comprises a thickness of about 8 micrometers at a second location at the protruding portion.

6. A structure according to claim 1 further comprising:
   an insulator layer on the conductive protective layer; and
   a diffusion barrier layer on the conductive protective layer.

7. A structure according to claim 1 wherein the conductive protective layer comprises a metal that forms an inter-metallic compound with solder.

8. A structure according to claim 1 wherein the conductive protective layer comprises a metal having a diffusivity into Si less than that of Gold, Copper, and Silver into Silicon.

9. A structure according to claim 1 wherein the conductive protective layer comprises a metal having a wettability with solder that is greater than Palladium, Titanium, Titanium Nitride, Tantalum, and Tantalum Nitride.

10. A structure according to claim 1 wherein the conductive protective layer comprises Ni and/or Co doped with a rare earth element or transition metal.

11. A structure according to claim 1 wherein the conductive protective layer comprises Ni doped with Vanadium and/or Phosphorus or comprises Co doped with Tungsten, Phosphorus, Chromium, and/or Boron.

12. A structure according to claim 2 further comprising:
   solder in the groove, wherein the solder is fully contained within the groove.

13. A structure according to claim 2 further comprising:
   solder in the groove, wherein the solder is configured to extend outside the groove.

14. A Through-Silicon-Via (TSV) structure comprising:
   a conductive via through a substrate extending from an upper surface of the substrate to a backside surface of the substrate opposite the upper surface, the conductive via being free of a groove to provide a planar upper surface of the conductive via;
   a conductive protective layer comprising Nickel and/or Cobalt at a bottom of the conductive via; and
   a polymer insulating layer on the backside surface of the substrate in contact with the conductive protective layer, wherein an outer surface of the polymer insulating layer has an inclined profile proximate to where a protruding portion of the conductive via protrudes from the backside surface of the substrate and contacts the polymer insulating layer.

15. A Through-Silicon-Via (TSV) structure comprising:
a conductive via through a substrate extending from an upper surface of the substrate to a backside surface of the substrate opposite the upper surface, the conductive via being free of a groove to provide a planar upper surface of the conductive via;
a conductive protective layer comprising Nickel and/or Cobalt at a bottom of the conductive via; and
a polymer insulating layer on the backside surface of the substrate in contact with the conductive protective layer, wherein the polymer insulating layer has a viscosity comprising about 290 cP, a resistivity of about $10^{10}$ ohm-cm, and a modulus of about 1 GPa to about 3 GPa.

16. A Through-Silicon-Via (TSV) structure comprising:
a conductive via through a substrate extending from an upper surface of the substrate to a backside surface of the substrate opposite the upper surface;
a conductive protective layer comprising Nickel and/or Cobalt at on side walls of the conductive via and absent from a bottom of the conductive via; and
a polymer insulating layer on the backside surface of the substrate in contact with the conductive protective layer.

17. The structure according to claim 16 wherein an outer surface of the polymer insulating layer has an inclined profile proximate to where a protruding portion of the conductive via protrudes from the backside surface of the substrate and contacts the polymer insulating layer.

18. The structure according to claim 16 wherein the polymer insulating layer has a viscosity comprising about 290 cP, a resistivity of about $10^{10}$ ohm-cm, and a modulus of about 1 GPa to about 3 GPa.

* * * * *